(12) United States Patent
Chung et al.

(10) Patent No.: US 10,002,045 B2
(45) Date of Patent: Jun. 19, 2018

(54) SEMICONDUCTOR MEMORY DEVICES HAVING INPUT/OUTPUT GATING CIRCUIT AND MEMORY SYSTEMS INCLUDING THE SAME

(71) Applicant: SAMSUNG ELECTRONICS CO., LTD., Suwon-si (KR)

(72) Inventors: Hoi-Ju Chung, Yongin-si (KR); Sang-Uhn Cha, Yongin-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days. days.

(21) Appl. No.: 15/209,043

(22) Filed: Jul. 13, 2016

(65) Prior Publication Data
US 2017/0031756 A1 Feb. 2, 2017

(30) Foreign Application Priority Data
Jul. 29, 2015 (KR) .................. 10-2015-0106945

(51) Int. Cl.
*G06F 11/10* (2006.01)
*G11C 11/4072* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .... G06F 11/1068; G06F 3/064; G06F 3/0679; G06F 3/0619; G11C 11/1675; G11C 7/20; G11C 11/4072; G11C 2029/0407
See application file for complete search history.

(56) References Cited

U.S. PATENT DOCUMENTS 5,742,615 A   4/1998  Kondo et al.
7,248,519 B2  7/2007  Kim
(Continued)

FOREIGN PATENT DOCUMENTS

JP   08-063406 A   3/1996
JP   08-203272 A   8/1996
(Continued)

OTHER PUBLICATIONS

P. Y. Chen, C. L. Su, C. H. Chen and C. W. Wu, "Generalization of an Enhanced ECC Methodology for Low Power PSRAM," in IEEE Transactions on Computers, vol. 62, No. 7, pp. 1318-1331, Jul. 2013.*

*Primary Examiner* — Cynthia Britt
(74) *Attorney, Agent, or Firm* — Sughrue Mion, PLLC

(57) ABSTRACT

A semiconductor memory device is provided. The semiconductor memory device includes a memory cell array, an input/output (I/O) gating circuit and an error correction circuit. The memory cell array includes a plurality of memory cells. The I/O gating circuit, before performing a normal memory operation on the memory cell array by a first unit, performs a cell data initializing operation by writing initializing bits in the memory cell array by a second unit different from the first unit. The error correction circuit performs an error correction code (ECC) encoding and an ECC decoding on a target page of the memory cell array by the second unit, based on the initializing bits. Therefore, power consumption in performing write operation may be reduced.

20 Claims, 15 Drawing Sheets

(51) Int. Cl.
*G06F 3/06* (2006.01)
*G11C 7/20* (2006.01)
*G11C 11/16* (2006.01)
*G11C 29/04* (2006.01)

(52) U.S. Cl.
CPC .............. *G06F 3/0679* (2013.01); *G11C 7/20* (2013.01); *G11C 11/1675* (2013.01); *G11C 11/4072* (2013.01); *G11C 2029/0407* (2013.01)

(56) References Cited

U.S. PATENT DOCUMENTS

| | | | |
|---|---|---|---|
| 7,278,015 | B2 | 10/2007 | Chu et al. |
| 8,069,312 | B2 | 11/2011 | Nasu |
| 8,140,937 | B2 | 3/2012 | Dasari et al. |
| 8,286,044 | B2 | 10/2012 | Foster, Sr. et al. |
| 2003/0009654 | A1* | 1/2003 | Nalawadi .............. G06F 9/4401 713/1 |
| 2007/0126608 | A1* | 6/2007 | Sriram .................. H03M 7/425 341/50 |
| 2008/0162991 | A1* | 7/2008 | Dell .................... G06F 11/1012 714/25 |
| 2016/0092306 | A1* | 3/2016 | Benedict ............. G06F 11/1076 714/764 |
| 2016/0163376 | A1* | 6/2016 | Bains .................. G11C 11/4093 365/189.05 |

FOREIGN PATENT DOCUMENTS

| | | |
|---|---|---|
| JP | 11-213671 A | 8/1999 |
| JP | 2004-335009 A | 11/2004 |
| JP | 2005-251244 A | 9/2005 |
| KR | 10-2000-0021309 A | 4/2000 |

* cited by examiner

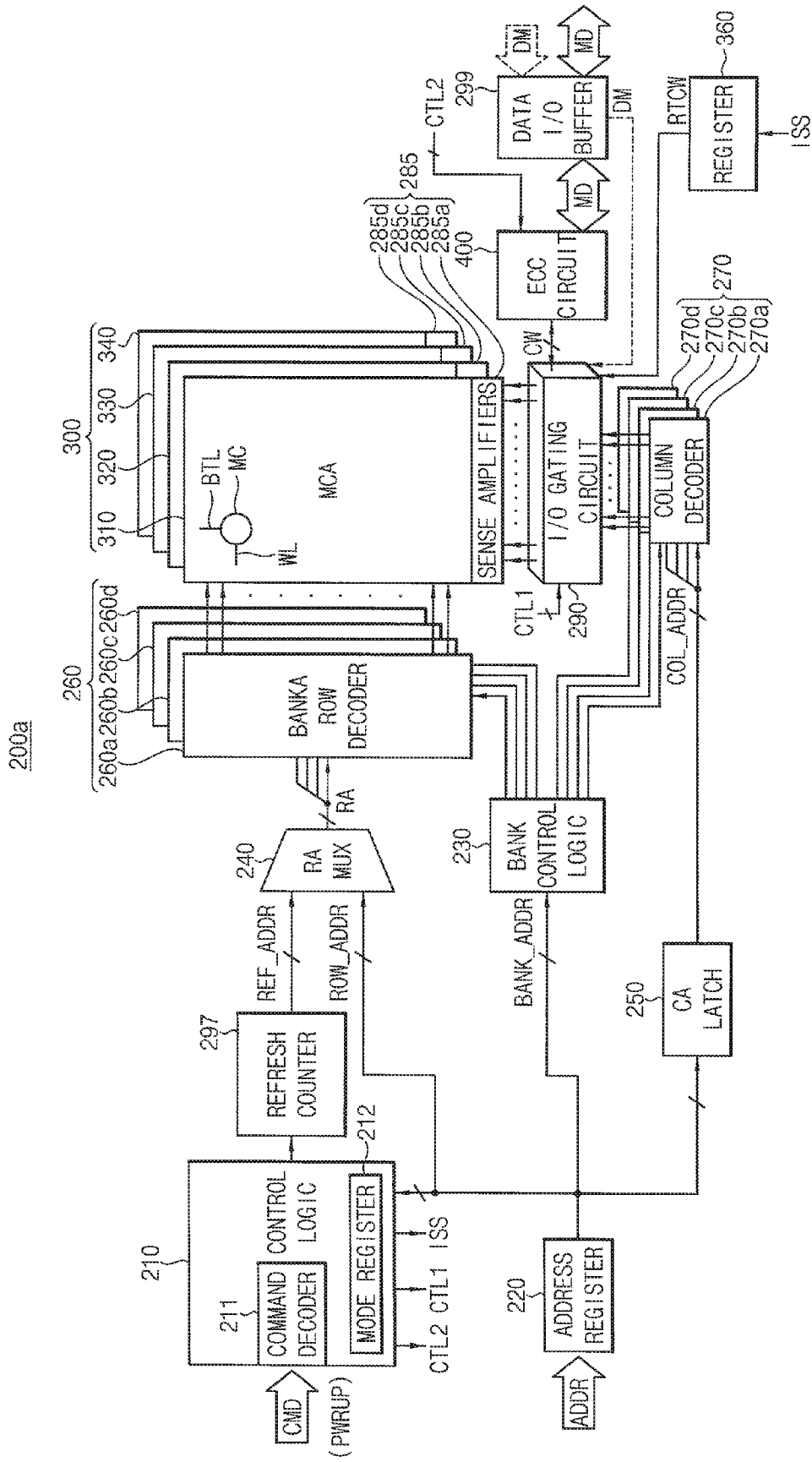

US 10,002,045 B2

SEMICONDUCTOR MEMORY DEVICES HAVING INPUT/OUTPUT GATING CIRCUIT AND MEMORY SYSTEMS INCLUDING THE SAME

CROSS-REFERENCE TO RELATED APPLICATIONS

This US non-provisional application claims the benefit of priority under 35 USC § 119 to Korean Patent Application No. 10-2015-0106945, filed on Jul. 29, 2015, in the Korean Intellectual Property Office, the content of which is incorporated by reference herein in its entirety.

BACKGROUND

The present disclosure relates to semiconductor memory devices and memory systems including the same.

Semiconductor memory devices may be classified into non-volatile memory devices such as flash memory devices and volatile memory devices such as dynamic random access memories (DRAMs). The volatile memory devices such as DRAMs are commonly employed as system memories for mass data, because DRAMs are inexpensive. Manufacturing processes are scaled in the volatile memory devices such as DRAMs for increasing memory density. In addition, in DRAMs, a unit of a write/read operation is different from a unit of error correction code (ECC) encoding/ECC decoding using the ECC.

SUMMARY

It is an aspect to provide a semiconductor memory device, capable of reducing overhead.

It is another aspect to provide a memory system including the semiconductor memory device, capable of reducing overhead.

According to an aspect of an exemplary embodiment, there is provided a semiconductor memory device comprising a memory cell array including a plurality of memory cells; an input/output (I/O) gating circuit configured to, before performing a normal memory operation on the memory cell array by a first unit, perform a cell data initializing operation by writing initializing bits in the memory cell array by a second unit different from the first unit; and an error correction circuit configured to perform an error correction code (ECC) encoding and an ECC decoding on a target page of the memory cell array by the second unit, based on the initializing bits.

The first unit may correspond to a prefetching unit of the semiconductor memory device when the semiconductor memory device performs a read operation or a write operation, the second unit may correspond to a codeword unit of the semiconductor memory device, and the codeword unit is greater than the prefetching unit.

The I/O gating circuit may perform the cell data initializing operation in response to an initializing write command from an external device.

The I/O gating circuit may perform the cell data initializing operation in response to a power-up signal from an external device.

The semiconductor memory device may further comprise a register that stores a plurality of subsets and provides one of the subsets as the initializing bits in response to an initializing start signal; and a control logic circuit configured to output the initializing start signal to the register in response to one of an initializing write command from an external device and a power-up signal from the external device.

The initializing bits may have one of a first logic level and a second logic level different from the first logic level.

The control logic circuit may be configured to generate a first control signal to control the I/O gating circuit and a second control signal to control the error correction circuit in response to one of the initializing write command and the power-up signal.

When the semiconductor memory device performs a write operation to write a write data by the second unit from an external device in the target page after performing the cell data initializing operation, the error correction circuit may read a reset codeword by the second unit from the target page, the reset codeword including a reset main data and a reset parity data, the reset main data and the reset parity data including the initializing bits; correct at least one error in the reset main data using the reset parity data; and generate a write parity data based on the write data and a portion of the reset main data, and the I/O gating circuit may write the write data and the write parity data in the target page.

The error correction circuit may comprise an ECC encoder configured to read the reset codeword to correct the at least one error in the reset main data; and an ECC decoder configured to generate the write parity data based on the write data and some of the reset main data.

The target page may include a normal region that stores the main data and a parity region that stores the write parity data.

Each of the memory cells may include one of a dynamic memory cell and a resistive type memory cell.

The I/O gating circuit may be configured to perform the cell data initializing operation during a power-up sequence of the semiconductor memory device.

According to another aspect of an exemplary embodiment, there is provided a memory system comprising at least one semiconductor memory device; and a memory controller configured to control the at least one semiconductor memory device, wherein the at least one semiconductor memory device comprises a memory cell array including a plurality of memory cells; an input/output (I/O) gating circuit configured to, before performing a normal memory operation on the memory cell array by a first unit, perform a cell data initializing operation by writing initializing bits in the memory cell array by a second unit different from the first unit; and an error correction circuit configured to perform an error correction code (ECC) encoding and an ECC decoding on a target page of the memory cell array by the second unit, based on the initializing bits.

The first unit may correspond to a prefetching unit of the semiconductor memory device when the semiconductor memory device performs a read operation or a write operation, the second unit may correspond to a codeword unit of the semiconductor memory device, the codeword unit is greater than the prefetching unit, and the memory cell array is a three-dimensional memory cell array.

The at least one semiconductor memory device may include a plurality of semiconductor memory devices mounted on a module board, the memory controller may apply one of an initializing write command and a power-up signal to each of the semiconductor memory devices, and each of the semiconductor memory devices may perform the cell data initializing operation in response to one of the initializing write command and the power-up signal.

According to another aspect of an exemplary embodiment, there is provided a semiconductor memory device comprising a memory cell array; and a control circuit configured to control a cell data initializing operation on the memory cell array by a unit of a codeword to initialize the memory cell array in a codeword state, prior to performing a normal access to the memory cell array by a unit of a prefetch, a size of the codeword unit being greater than a size of the prefetch unit.

The control circuit may perform the cell data initializing operation by writing initializing bits in the memory cell array by the unit of the codeword.

The control circuit may be further configured to perform an error correction code (ECC) encoding and an ECC decoding on a target page of the memory cell array by the prefetch unit, based on the initializing bits.

The target page may include a normal region that stores main data and a parity region that stores write parity data.

Memory cells of the memory cell array may include a magnetoresistive random access memory (MRAM).

BRIEF DESCRIPTION OF THE DRAWINGS

Exemplary embodiments will be described below in more detail with reference to the accompanying drawings, in which:

FIG. 3 is a block diagram illustrating a semiconductor memory device of the memory system shown in FIG. 2, according to exemplary embodiments;

DETAILED DESCRIPTION

Figure 1:
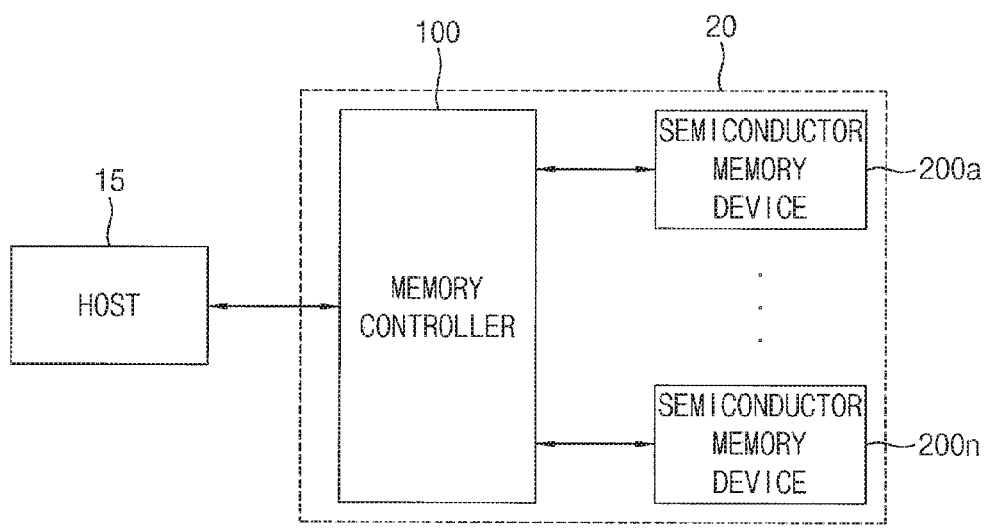
FIG. 1 is a block diagram illustrating an electronic system according to exemplary embodiments.

Various exemplary embodiments will be described more fully hereinafter with reference to the accompanying drawings, in which some exemplary embodiments are shown. However, the present inventive concept may be embodied in many different forms and should not be construed as limited to the exemplary embodiments set forth herein. These exemplary embodiments are just for disclosing of the inventive concept and many implementations and variations are possible that do not require the details provided herein. It should also be emphasized that the present inventive concept provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present inventive concept. In the drawings, the sizes and relative sizes of layers and regions may be exaggerated for clarity. Like numerals refer to like elements throughout.

It will be understood that, although the terms "first", "second", "third" etc. may be used herein to describe various elements, these elements should not be limited by these terms. These terms are generally used to distinguish one element from another. Thus, a "first" element discussed below in one section of the specification could be termed a "second" element in a different section of the specification without departing from the teachings of the present inventive concept. Also, terms such as "first" and "second" may be used in the claims to name an element of the claim, even thought that particular name is not used in description in connection with the element in the specification. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to exemplary embodiments.

Referring to FIG. 1, an electronic system 10 may include a host 15 and a memory system 20. The memory system 20 may include a memory controller 100 and a plurality of semiconductor memory devices 200a~200n (n is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of semiconductor memory devices 200a~200n. For example, the memory controller 100 may write data in the plurality of semiconductor memory devices 200a~200n and/or read data from the plurality of semiconductor memory devices 200a~200n in response to request from the host 15.

In addition, the memory controller 100 may issue operation commands to the plurality of semiconductor memory devices 200a~200n for controlling the plurality of semiconductor memory devices 200a~200n.

In some exemplary embodiments, each of the plurality of semiconductor memory devices 200a~200n may be a memory device including resistive type memory cells such as a magnetoresistive random access memory (MRAM), a resistive random access memory (RRAM), a phase change random access memory (PRAM) and a ferroelectric random access memory (FRAM), etc. In other exemplary embodiments, each of the plurality of semiconductor memory devices 200a~200n may be a memory device including dynamic memory cells such as a dynamic random access memory (DRAM).

An MRAM is a nonvolatile computer memory based on magnetoresistance. An MRAM is different from a volatile RAM in many aspects. For example, since an MRAM is nonvolatile, the MRAM may retain stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

Figure 2:
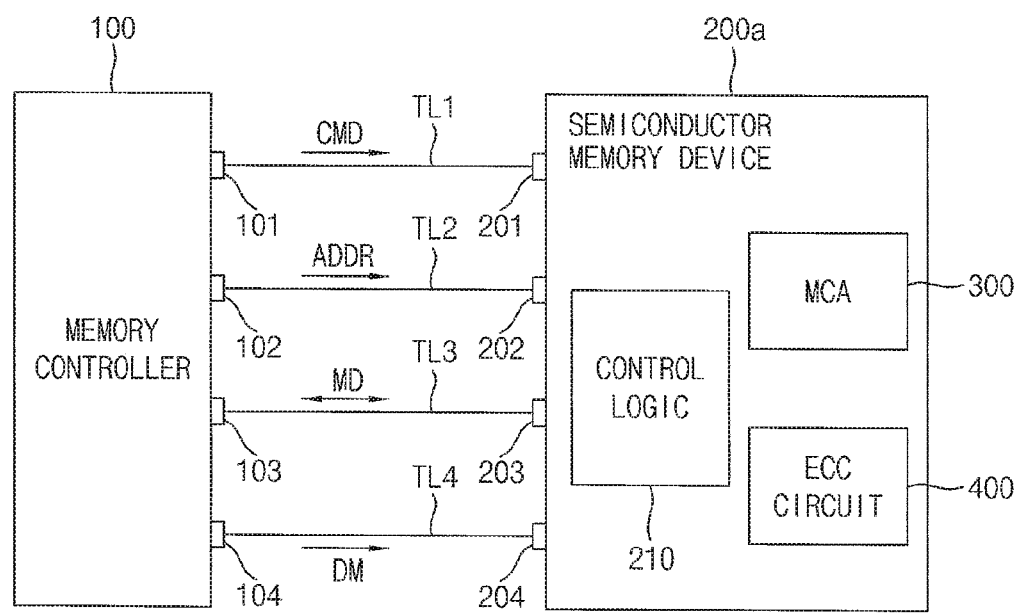
FIG. 2 is a block diagram illustrating a memory system of the electronic device shown in FIG. 1, according to exemplary embodiments.

FIG. 2 is a block diagram illustrating the memory system 20 shown in FIG. 1 in more detail.

In FIG. 2, only one semiconductor memory device 200a in communication with the memory controller 100 is illustrated for convenience. However, the details discussed herein related to semiconductor memory device 200a may equally apply to the other semiconductor memory devices 200b~200n.

Referring to FIG. 2, the memory system 20 may include the memory controller 100 and the semiconductor memory device 200a. The memory controller 100 and the semiconductor memory device 200a may be connected to each other through corresponding command pins 101 and 201, corresponding address pins 102 and 202, corresponding data pins 103 and 203 and corresponding extra pins 104 and 204. That is, the memory controller 100 has a command pin 101, an address pin 102, a data pin 103, and an extra pin 104, and the semiconductor memory device 200a has a command pin 201, an address pin 202, a data pin 203, and an extra pin 204. It should be noted that, in some exemplary embodiments, each of the pins 101, 102, 103, 104, 201, 202, 203, and 204 may be provided as a plurality of pins. The command pins 101 and 201 may transmit a command signal CMD through a command transmission line TL1, the address pins 102 and 202 may transmit an address signal ADDR through an address transmission line TL2, and the data pins 103 and 203 may exchange main data MD through a data transmission line TL3. The extra pins 104 and 204 may transmit a data mask signal DM through an extra transmission line TL4. As will be described later, the semiconductor memory device 200a may perform a masked write operation in response to the data mask signal DM. In some exemplary embodiments, the extra pins 104 and 204 and the extra transmission line TL4 may be omitted in the semiconductor memory device 200a.

The semiconductor memory device 200a may include a memory cell array (MCA) 300 that stores the main data MD, an error correction circuit (ECC Circuit) 400 and a control logic (or, a control logic circuit) 210 that controls the ECC circuit 400. When the command signal CMD is an initializing write command, the semiconductor memory device 200 may perform a cell data initializing operation to render the memory cells in the memory cell array (MCA) 300 in a codeword state, by a codeword unit (i.e., a second unit) of the semiconductor memory device 200a. In addition, when the command signal CMD directs a normal write operation write command, the semiconductor memory device 200 may perform write/read operation by a prefetching unit (i.e., a first unit) of the semiconductor memory device 200. The second unit may be greater than the first unit. That is, a size of the codeword unit may be greater than a size of the prefetching unit.

FIG. 3 is a block diagram illustrating the semiconductor memory device 200a shown in FIG. 2 in more detail, according to exemplary embodiments.

Referring to FIG. 3, the semiconductor memory device 200a may include a control logic (or a control logic circuit) 210, an address register 220, a bank control logic 230, a refresh counter 297, a row address multiplexer (RA MUX) 240, a column address latch (CA LATCH) 250, a row decoder 260, a column decoder 270, the memory cell array 300, a sense amplifier 285, an input/output (I/O) gating circuit 290, the ECC circuit 400, a data input/output (I/O) buffer 299 and a register 360.

When the semiconductor memory device 200a is a resistive type memory device, the refresh counter 297 may be omitted from the semiconductor memory device 200a.

The memory cell array (MCA) 300 may include first through fourth bank arrays 310~340. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier 285 may include first through fourth bank sense amplifiers 285a~280d respectively coupled to the first through fourth bank arrays 310~340. Each of the first through fourth bank arrays 310~340 may include a plurality of memory cells MC, and each of memory cells MC is coupled to a corresponding word-line WL and a corresponding bit-line BTL. The first through fourth bank arrays 310~340, the first through fourth bank row decoders 260a~260d, the first through fourth bank column decoders 270a~270d and first through fourth bank sense amplifiers 285a~280d may form first through fourth banks. Although the semiconductor memory device 200a shown in FIG. 3 illustrates four banks, the semiconductor memory device 200a may include another number of banks. That is, the number of banks is not particularly limited and may be less than four or more than four.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer (RA MUX) 240, and may provide the received column address COL_ADDR to the column address latch (CA LATCH) 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 may be included when the semiconductor memory device 200a is implemented by DRAM. The refresh counter 297 may generate a refresh row address REF_ADDR for refreshing memory cell rows in the memory cell array (MCA) 300 under control of the control logic 210. The refresh counter 297 may be omitted when the semiconductor memory device 200a is implemented by MRAM.

The row address multiplexer (RA MUX) 240 may receive the row address ROW_ADDR from the address register 220, and may receive the refresh row address REF_ADDR from the refresh counter 297. The row address multiplexer (RA MUX) 240 may selectively output the row address ROW_ADDR or the refresh row address REF_ADDR as a row address RA. The row address RA that is output from the row address multiplexer (RA MUX) 240 may be applied to the first through fourth bank row decoders 260a~260d.

The activated one of the first through fourth bank row decoders 260a~260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch (CA LATCH) 250 may receive the column address COL_ADDR from the address register 220, and may temporarily store the received column address COL_ADDR. In some exemplary embodiments, in a burst mode, the column address latch (CA LATCH) 250 may generate column addresses that increment from the received column address COL_ADDR. The column address latch (CA LATCH) 250 may apply the temporarily stored or generated column address to the first through fourth bank column decoders 270a~270d.

The activated one of the first through fourth bank column decoders 270a~270d may decode the column address COL_ADDR that is output from the column address latch (CA LATCH) 250, and may control the I/O gating 290 in order to output data corresponding to the column address COL_ADDR.

The I/O gating circuit 290 may include circuitry for gating input/output data. The I/O gating circuit 290 may further include read data latches for storing data that is output from the first through fourth bank arrays 310~340, and write drivers for writing data to the first through fourth bank arrays 310~340.

The I/O gating circuit 290, before the normal memory operation is performed on the memory cell array 300 by the first unit (i.e., the prefetching unit), performs the cell data initializing operation by writing initializing bits in the memory cell array (MCA) 300 by the second unit (i.e., the codeword unit).

In a normal mode, a codeword CW read from one bank array of the first through fourth bank arrays 310~340 may be sensed by sense amplifiers coupled to the one bank array from which the data is to be read, and may be stored in the read data latches. The codeword CW stored in the read data latches may be provided to the memory controller 100 via the ECC circuit 400 and the data I/O buffer 299. Main data MD to be written in one bank array of the first through fourth bank arrays 310~340 may be provided to the data I/O buffer 299 from the memory controller 100. The main data MD provided to the data I/O buffer 299 is encoded to the codeword CW in the ECC circuit 400. The write driver may write the codeword CW in one bank array of the first through fourth bank arrays 310~340.

The data I/O buffer 299 provides the ECC circuit 400 with the main data MD from the memory controller 100 in a write operation of the normal mode, and provides the main data MD from the ECC circuit 400 to the memory controller 100 in a read operation of the normal mode. In addition, the data I/O buffer 299 provides the data mask signal DM to the I/O gating circuit 290.

The ECC circuit 400, in a write operation of the normal mode, may generate parity data based on the main data MD from the data I/O buffer 299, and may provide the I/O gating circuit 290 with the codeword CW including the main data MD and the parity data. The I/O gating circuit 290 may write the codeword CW to a target page of the memory cell array 300. In addition, the ECC circuit 400, in a read operation of the normal mode, may receive the codeword CW, read from the target page of the memory cell array (MCA) 300, from the I/O gating circuit 290. The ECC circuit 400 may perform an ECC decoding on the main data MD based on the parity data in the codeword CW, may correct a single bit error in the main data MD and may provide corrected main data to the data I/O buffer 299.

The register 360 stores a plurality of subsets and provides the I/O gating circuit 290 with one of the subsets as a reset codeword (or initializing codeword) RTCW. The reset codeword RTCW may include initializing bits corresponding to one of the subsets.

The control logic 210 may control operations of the semiconductor memory device 200a. For example, the control logic 210 may generate control signals for the semiconductor memory device 200a in order to perform a write operation or a read operation. The control logic 210 may include a command decoder 211 that decodes a command CMD received from the memory controller 100, and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic 210 may generate a first control signal CTL1 to control the I/O gating circuit 290, a second control signal CTL2 to control the ECC circuit 400 and the initializing start signal ISS to control the register 360 by decoding the command CMD. When the command CMD corresponds to the initializing write command, the control logic 210 provides the initializing start signal ISS to the register 360. The control logic 210 provides the initializing start signal ISS to the register 360 in response to a power-up signal PWRUP from the memory controller 100 during a power-up sequence of the semiconductor device 200a.

The register 360 provides the I/O gating circuit 290 with one of the subsets as the reset codeword RTCW and the I/O gating circuit 290 performs the cell data initializing operation on the memory cell array (MCA) 300 by writing the initializing bits in the memory cells by the second unit (i.e., codeword unit) or by a page unit. After the cell data initializing operation is performed on the memory cell array 300, the normal memory operation on the memory cell array 300 may be performed. The normal memory operation may include write and read operation on the memory cell array (MCA) 300. The normal memory operation is performed on the memory cell array (MCA) 300 by the first unit (i.e., the prefetching unit) smaller than the second unit (i.e., codeword unit). The first unit corresponds to the prefetching unit of the semiconductor memory device 200a.

FIGS. 4A to 4E are circuit diagrams of examples of the memory cell shown in FIG. 3, according to exemplary embodiments.

Figure 4A:
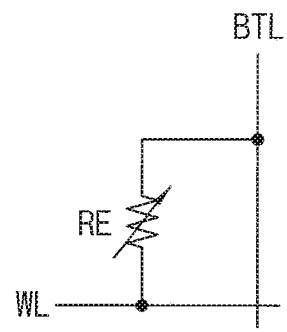
FIGS. 4A to 4E are circuit diagrams of examples of a memory cell in the semiconductor memory device shown in FIG. 3, according to exemplary embodiments.
Figure 4B:
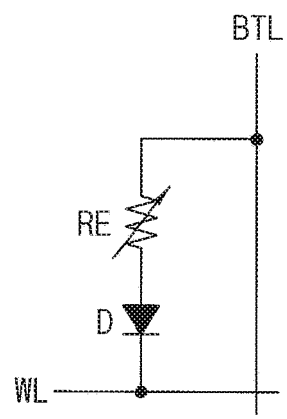
Figure 4C:
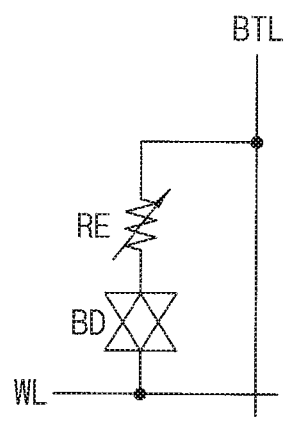
Figure 4D:
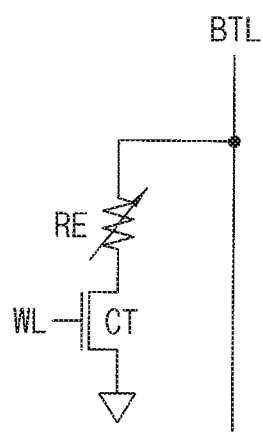
Figure 4E:
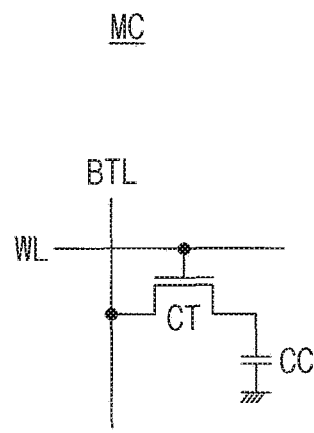

FIGS. 4A to 4D illustrate memory cells MC which are implemented with resistive type memory cells, and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC may include a resistive element RE connected to a bit-line BTL and a word-line WL. Such a resistive memory cell having a structure without a selection element may store data by a voltage applied between bit-line BL and word-line WL.

Referring to FIG. 4B, a memory cell MC may include a resistive element RE and a diode D. The resistive element RE may include a resistive material for data storage. The diode D may be a selection element (also called a switching element) that supplies current to resistive element RE or cuts off the current supply to resistive element RE according to a bias of word-line WL and bit-line BTL. The diode D may be coupled between the resistive element RE and word-line WL, and the resistive element RE may be coupled between the bit-line BTL and the diode D. Positions of the diode D and the resistive element RE may be interchanged. The diode D may be turned on or turned off by a word-line voltage. Thus, a resistive memory cell may be not driven where a voltage of a constant level or higher is supplied to an unselected word-line WL.

Referring to FIG. 4C, a memory cell MC may include a resistive element RE and a bidirectional diode BD. The resistive element R may include a resistive material for data storage. The bidirectional diode BD may be coupled between the resistive element RE and a word-line WL, and the resistive element RE may be coupled between a bit-line BTL and bidirectional diode BD. Positions of the bidirectional diode BD and the resistive element RE may be interchanged. The bidirectional diode BD may block leakage current flowing to an unselected semiconductor memory cell.

Referring to FIG. 4D, a memory cell MC may include a resistive element RE and a transistor CT. The transistor CT may be a selection element (also called a switching element) that supplies current to the resistive element RE or cuts off the current supply to the resistive element RE according to a voltage of a word-line WL. The transistor CT may be coupled between the resistive element RE and a word-line WL, and the resistive element RE may be coupled between a bit-line BTL and the transistor CT. Positions of the transistor CT and the resistive element RE may be interchanged. The semiconductor memory cell may be selected or unselected depending on whether the transistor CT driven by word-line WL is turned on or turned off.

Referring to FIG. 4E, a memory cell MC may include a cell capacitor CC and a transistor CT. The transistor CT may be a selection element (also called a switching element) that connects/disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage (not illustrated).

Figure 5:
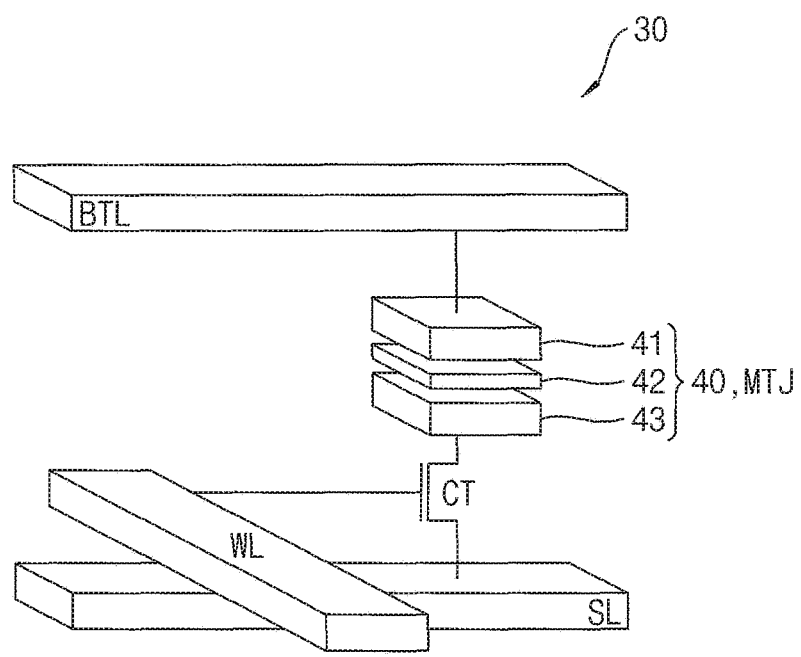
FIG. 5 illustrates an example of a memory cell (referred to as an STT-MRAM cell) of the semiconductor memory device shown in FIG. 3, according to exemplary embodiments.

FIG. 5 illustrates an example of the memory cell 30 (referred to as an STT-MRAM cell) shown in FIG. 3, according to exemplary embodiments.

Referring to FIG. 5, an STT-MRAM cell 30 may include a MTJ element 40 and a cell transistor CT. A gate of the cell transistor CT is connected to a word-line WL and one electrode of the cell transistor CT is connected through the MTJ 40 to a bit-line BTL. The other electrode of the cell transistor CT is connected to a source line SL.

The MTJ element 40 may include a free layer 41, a pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further provided.

In order to perform a write operation of the STT-MRAM cell 30, a logic high voltage is applied to the word-line WL to turn on the cell transistor CT. A program current, for example, a write current is applied to the bit-line BL and the source line SL. A direction of the write current is determined by a logic state of the MTJ element 40.

In order to perform a read operation of the STT-MRAM cell 30, a logic high voltage is applied to the word-line WL to turn on the cell transistor CT, and a read current is supplied to the bit-line BL and the source line SL. Accordingly, a voltage is developed at both ends of the MTJ element 40, is detected by the sense amplifier 285a, and is compared with a reference voltage from a reference voltage to determine a logic state of the MTJ element 40. Accordingly, data stored in the MTJ element 40 may be detected.

Figure 6:
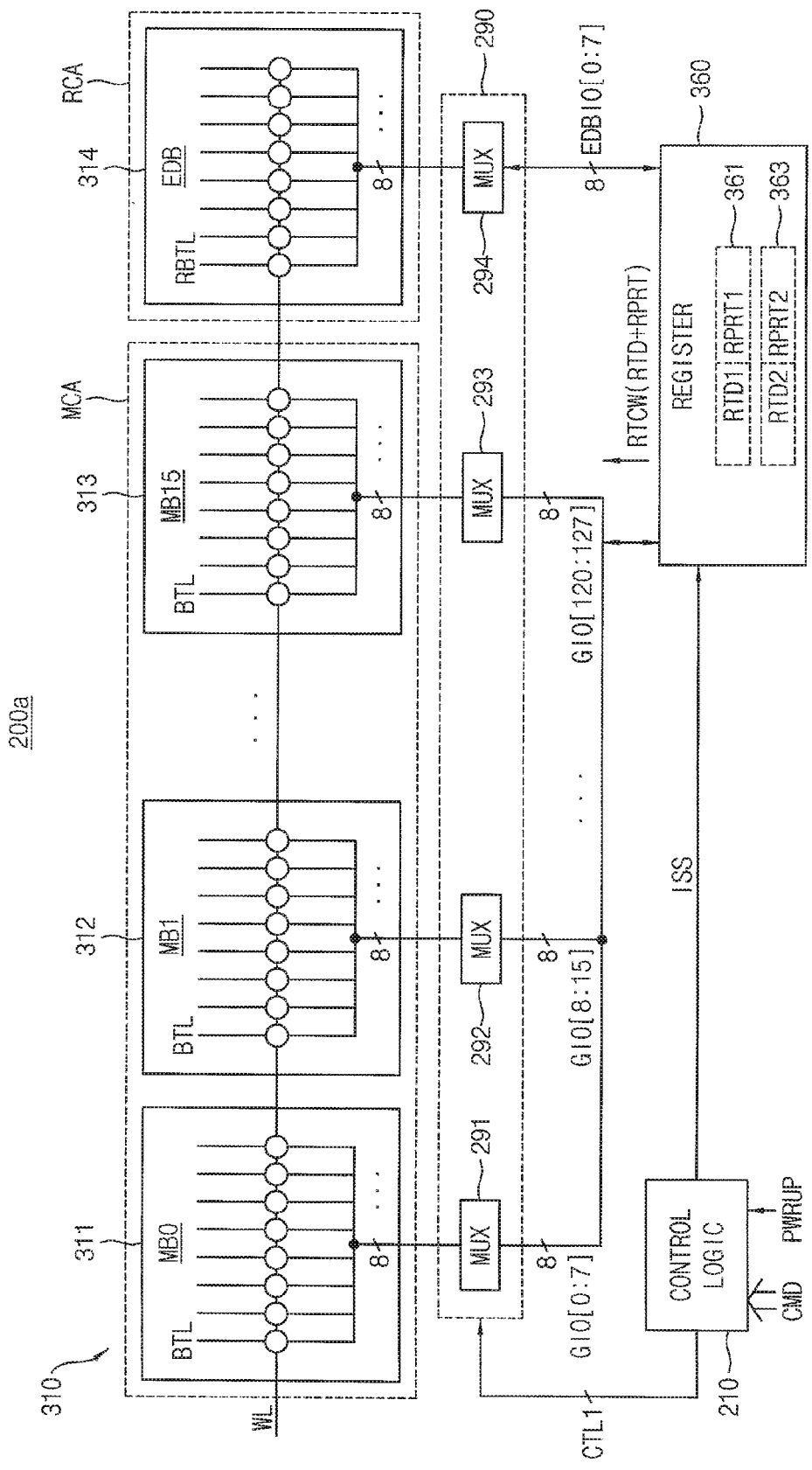
FIG. 6 illustrates a portion of the semiconductor memory device of FIG. 3, when a cell data initializing operation is performed.

FIG. 6 illustrates a portion of the semiconductor memory device of FIG. 3, when the cell data initializing operation is performed.

In FIG. 6, the control logic 210, the first bank array 310, the I/O gating circuit 290, and the register 360 are illustrated.

Referring to FIG. 6, the first bank array 310 may include a normal cell array NCA and a redundancy cell array RCA. The normal cell array NCA may include a plurality of first memory blocks MB0~MB15 311~313, and the redundancy cell array RCA may include at least a second memory block 314. The first memory blocks 311~313 are memory blocks determining a memory capacity of the semiconductor memory device 200a. The first memory blocks 311~313 may be referred to as a first region or a normal region. The second memory block 314 is for ECC and/or redundancy repair. Since the second memory block 314 for ECC and/or redundancy repair is used for ECC, data line repair and block repair to repair 'fail' cells generated in the first memory blocks 311~313, the second memory block 114 is also referred to as an EDB block. The second memory block 114 may be referred to a parity region.

In each of the first memory blocks 311~313, a plurality of first memory cells are arrayed in rows and columns. In the second memory block 314, a plurality of second memory cells are arrayed in rows and columns.

In the first memory blocks 311~313, rows may be formed, for example, of 8K word-lines WL, and columns may be formed, for example, of 1K bit-lines BTL. The first memory cells connected to intersections of the word-lines WL and the bit-lines BTL may be dynamic memory cells or resistive type memory cells. In the second memory block 314, rows may be formed, for example, of 8K word-lines WL, and columns may be formed, for example, of 1K bit-lines BTL. The second memory cells connected to intersections of the word-lines WL and the bit-lines RBTL may be dynamic memory cells or resistive type memory cells.

The I/O gating circuit 290 includes a plurality of switching circuits 291~294. The switching circuits 291~293 are respectively connected to the first memory blocks 311~313, and the switching circuit 294 is connected to the second memory block 314. In the semiconductor memory device 200a, bit lines corresponding to data of a burst length (BL) may be simultaneously accessed to support the BL indicating the maximum number of column positions that is accessible. For example, if the BL is set to 8, data bits may be set to 128 bits.

The register 360 is connected to the switching circuits 291~294 through corresponding first data lines GIO[0:127] and second data lines EDBIO[0:7].

When the cell data initializing operation is performed, the register 360 provides the I/O gating circuit 290 with one of the subsets 361 and 363 as the reset codeword RTCW in response to the initializing start signal ISS. The reset codeword RTCW may include a reset main data RTD and a reset parity data RPRT. The subset 361 may include a reset main data RTD1 and a reset parity data RPRT1. The subset 362 may include a reset main data RTD2 and a reset parity data RPRT2. Each data bit of the subset 361 may have a first logic level (e.g., a logic low level) and each data bit of the subset 362 may have a second logic level (e.g., a logic high level).

Figure 7:
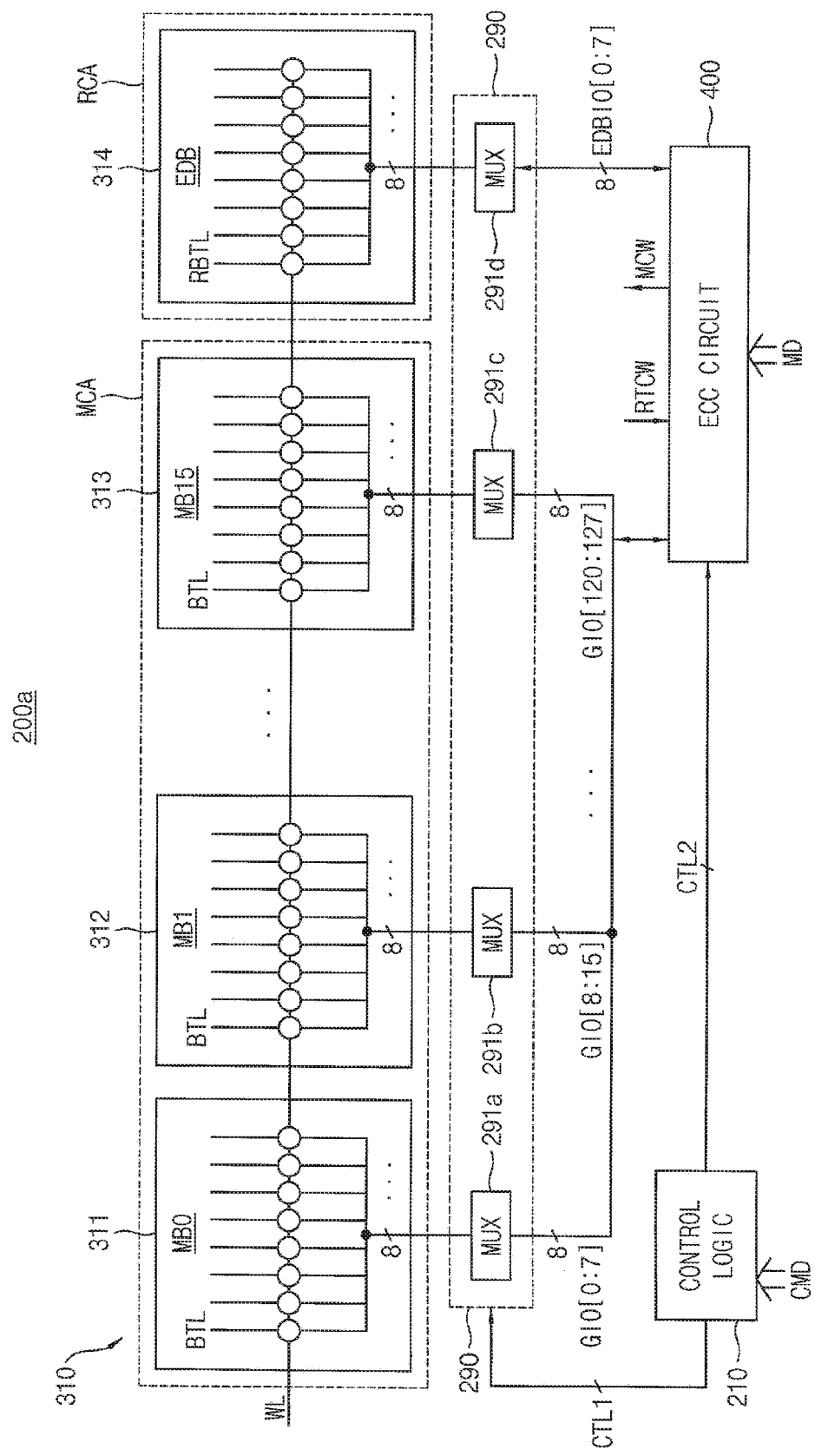
FIG. 7 illustrates a portion of the semiconductor memory device of FIG. 3, when a normal memory operation is performed.

FIG. 7 illustrates a portion of the semiconductor memory device of FIG. 3, when the normal memory operation is performed.

In FIG. 7, the control logic 210, the first bank array 310, the I/O gating circuit 290, and the error correction circuit 400 are illustrated.

The error correction circuit 400 is connected to the switching circuit 291~294 through corresponding first data lines GIO[0:127] and second data lines EDBIO[0:7].

When the semiconductor memory device 200a performs a write operation to write the first unit of main data MD, the I/O gating circuit 290 reads the reset codeword RTCW including the initializing bits from a target page of the memory block 311~314 and provides the reset codeword RTCW to the error correction circuit 400. The ECC circuit 400 corrects at least one error of the reset main data RTD using the reset parity data RPRT and generates a write parity data based on the main data MD and some of the reset main data RTD. The I/O gating circuit 290 writes the main data MD and the write parity data in the target page in the memory blocks 311~314.

Figure 8:
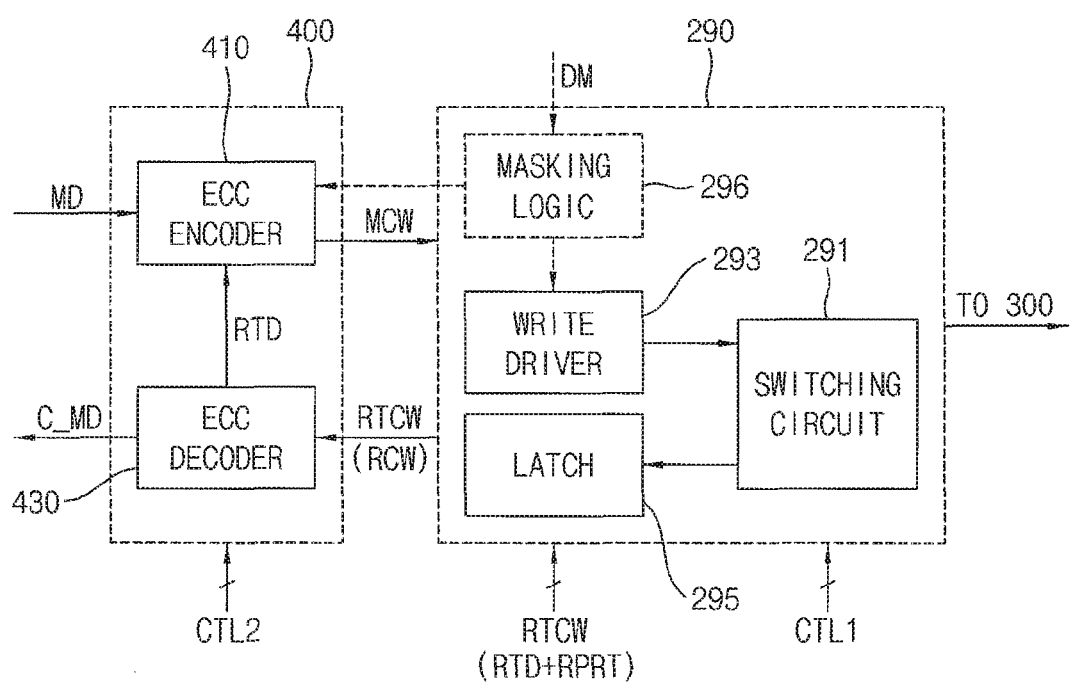
FIG. 8 illustrates an ECC circuit and an I/O gating circuit in the semiconductor memory device of FIG. 3, according to exemplary embodiments.

FIG. 8 illustrates the error correction circuit 400 and the I/O gating circuit 290 in the semiconductor memory device of FIG. 3 according to exemplary embodiments.

Referring to FIG. 8, the error correction circuit 400 includes an ECC encoder 410 and an ECC decoder 430. The I/O gating circuit 290 includes a switching circuit 291, a write driver 293 and a latch 295. The I/O gating circuit 290 may further include a masking logic 296. The switching circuit 291 may include the switches 291a~291d in FIGS. 6 and 7.

The write driver 293 receives the second unit of the reset codeword RTCW from the register 260 and performs the cell data initializing operation to write the initializing bits in the memory cell array 300 during the power-up sequence. The ECC decoder 410 reads the reset codeword RTCW from the target page of the memory cell array 300, corrects the at least one error of the reset main data RTD and provides the reset main data RTD to the ECC encoder 410 in a write operation after the cell data initializing operation. The ECC encoder 410 generates the write parity data based on the first unit of the main data MD and a portion of the reset main data RTD, and the write driver may write the first unit of the main data MD and the write parity data in the target page. The main data MD and the write parity data may correspond to a modified codeword MCW.

The I/O gating circuit 290 provides the ECC decoder 430 with a read codeword RCW from the target page in a read operation of the normal mode and the ECC decoder 430 performs an ECC decoding on the read codeword RCW to output a corrected main data C_MD.

The masking logic 296 controls the write driver 293 and the ECC encoder 410 to perform a masked write operation in response to a data mask signal DM from the memory controller 100 in a masked write operation.

Figure 9:
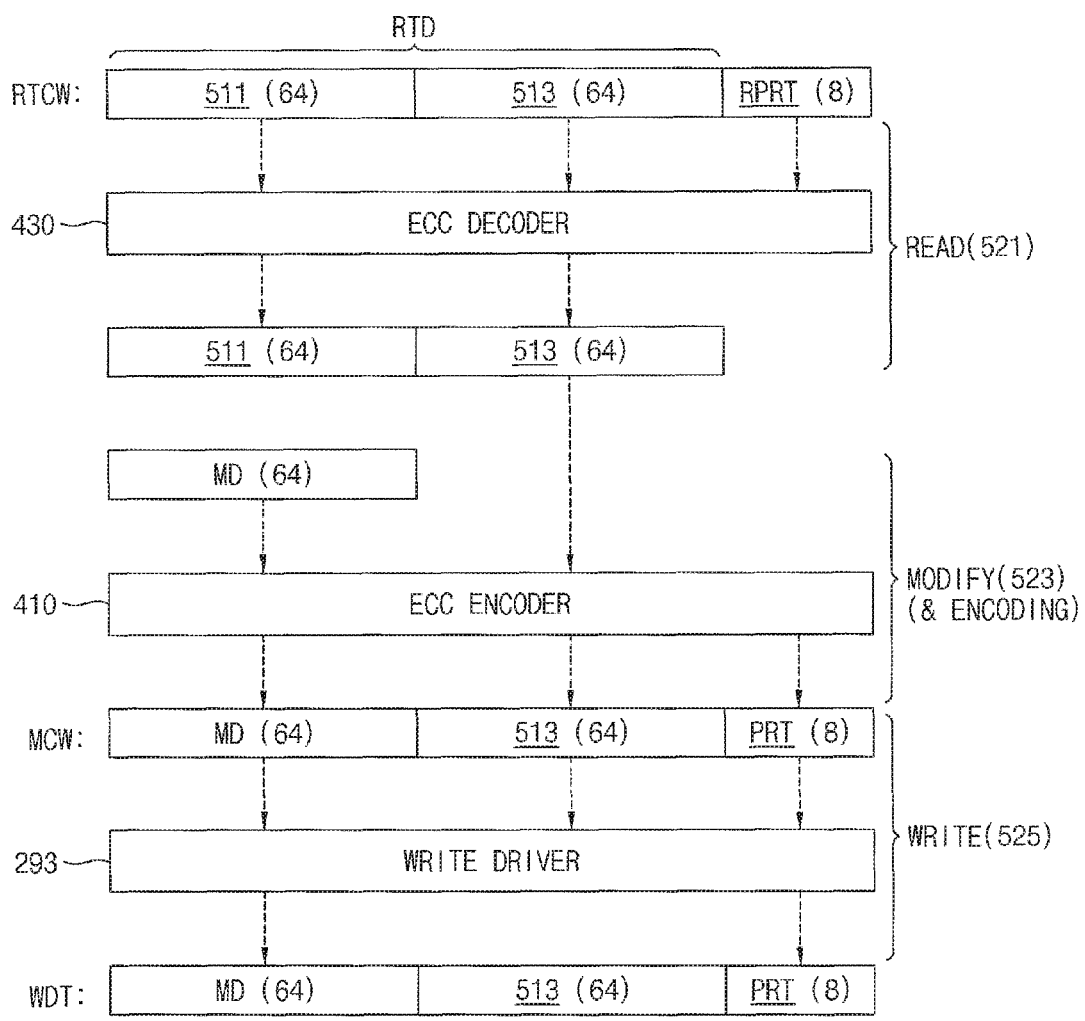
FIG. 9 illustrates a write operation on the target page after the cell data initializing operation is performed in the semiconductor memory device of FIG. 7.

FIG. 9 illustrates a write operation on the target page after the cell data initializing operation is performed in the semiconductor memory device of FIG. 7.

Referring to FIGS. 7 through 9, after the cell data initializing operation is performed on the memory cell array, the memory cells are in codeword state. The reset codeword RTCW in the target page includes 128-bit reset main data RTD and 8-bit reset parity data RPRT. The reset main data RTD includes a 64-bit first portion 511 and a 64-bit second portion 513. When the first unit of 64-bit main data MD is input, the ECC decoder 430 receives the 128-bit reset codeword RTCW from the target page via the I/O gating circuit 290 and corrects at least one error in the reset main data RTD using the reset parity data RTD.

The ECC encoder 410 receives the 64-bit main data MD. The ECC encoder 410 generates 8-bit write parity data PRT based on the 64-bit main data MD and the second portion 513 of the reset main data RTD and provides the write driver 293 with the modified codeword MCW including the main data MD, the second portion 513 and the write parity data PRT. The write driver 293 writes the 64-bit main data MD and the 8-bit write parity data PRT in the target page. A codeword WDT stored in the target page includes the 64-bit main data MD, the 64-bit second portion 513 and the 8-bit write parity data PRT. Although in FIG. 9, the main data MD includes 64-bits, the main data MD may include 32-bits.

In FIG. 9, a reference numeral 521 indicates a read operation performed by the I/O gating circuit 290 and the ECC decoder 430, a reference numeral 523 indicates a modification (and encoding) operation performed by the ECC encoder 410, and a reference numeral 525 indicates write operation performed by the write driver 293. FIG. 9 illustrates an example of read-modify-write operation.

If the memory cells are not in the codeword state, in the case when the cell data initializing operation is not performed errors may occur in the read operation 521 and the write driver 293 needs to write a 132-bit codeword in the target page. Therefore, power consumption in the write operation may increase.

Figure 10:
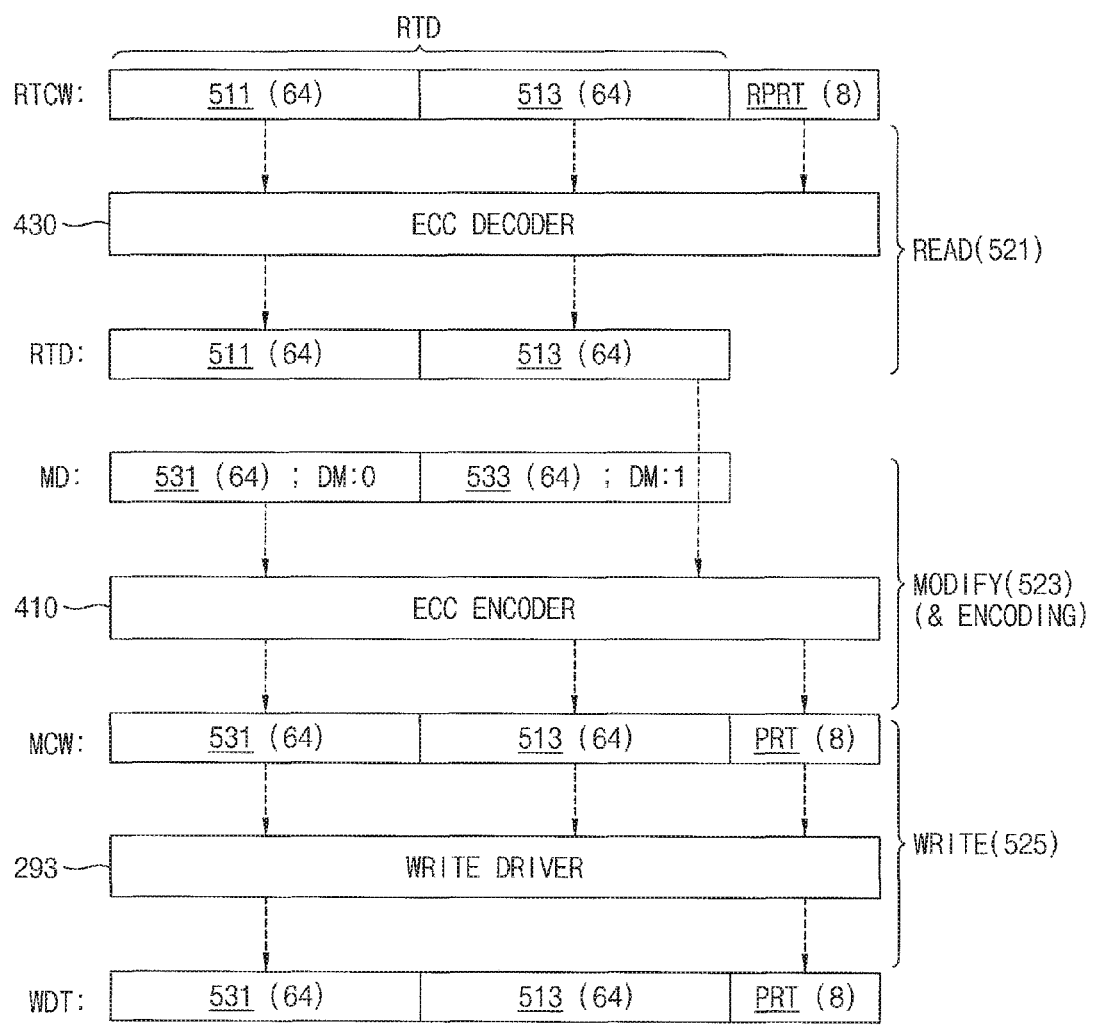
FIG. 10 illustrates a masked write operation on the target page after the cell data initializing operation is performed in the semiconductor memory device of FIG. 7.

FIG. 10 illustrates a masked write operation on the target page after the cell data initializing operation is performed in the semiconductor memory device of FIG. 7.

The masked write operation of FIG. 10 differs from the write operation of FIG. 9 in that the write main data MD includes a 64-bit first portion 531 and a 64-bit second portion 533 and a data mask signal DM is input. The data mask signal DM for the first portion 531 is a low level and the data mask signal DM for the second portion 533 is a high level. Therefore, the first portion 531 of the write data MD and the write parity data PRT are to be written in the target page.

Figure 11:
FIG. 11 illustrates an example of reset data when initializing bits are written in a memory cell array by a page unit.

FIG. 11 illustrates an example of the reset data when the initializing bits are written in the memory cell array by a page unit.

Referring to FIG. 11, when the cell data initializing operation is performed on the memory cell array 300 by the page unit (i.e., by a word-line unit) not by the codeword, a reset data RTDT may include a plurality of reset codewords RTCW1~RTCWp, where p is an integer greater than one. The reset codewords RTCW1~RTCWp may be sequentially written in a page.

Figure 12:
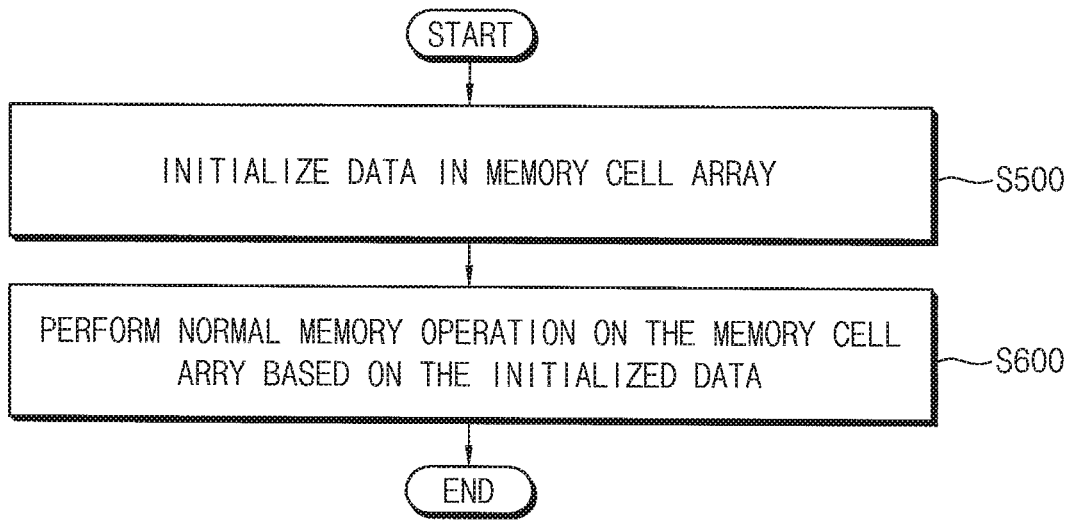
FIG. 12 illustrates a method of operating a semiconductor memory device according to exemplary embodiments.

FIG. 12 illustrates a method of operating a semiconductor memory device according to exemplary embodiments.

Referring to FIGS. 3 through 12, in a method of operating the semiconductor memory device 200a, the I/O gating circuit 290 initializes the memory cell array 300 (S500). The I/O gating circuit 290 may initialize the memory cell array 300 by writing initializing bits, by the codeword unit, in the memory cells of the memory cell array 300. The error correction circuit 400 and the I/O gating circuit 290 perform a normal memory operation on the memory cell array based on the initialized data (S600). The error correction circuit 400 and the I/O gating circuit 290 may perform the normal memory operation on the target page of the memory cell array 300 by the first unit smaller than the codeword unit based on the initializing bits and the main data.

Figure 13:
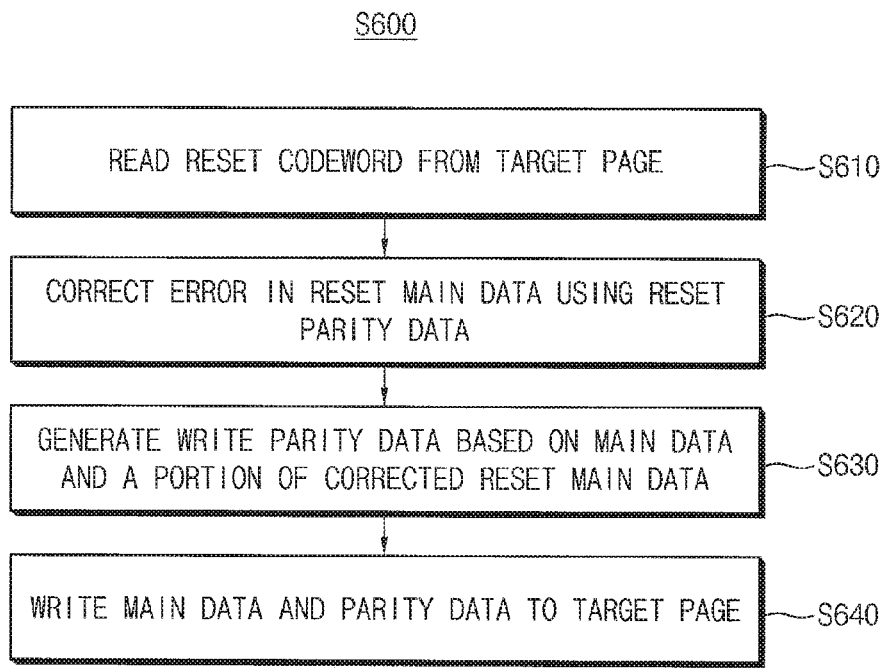
FIG. 13 illustrates a normal memory operation of the method in FIG. 12 according to exemplary embodiments.

FIG. 13 illustrates the normal memory operation S600 in FIG. 12 according to exemplary embodiments.

Referring to FIGS. 3 through 13, for performing the normal memory operation S600, the error correction circuit 400 reads the reset codeword RTCW including the initializing bits from the target page (S610). The ECC decoder 430 corrects at least one error in the reset main data RTD using the reset parity data RPRT (S620). The ECC encoder 410 generates the write parity data PRT based on the first unit of main data MD and a portion of the reset main data RTD (S630). The I/O gating circuit 290 writes the main data MD and the write parity data PRT in the target page (S640).

Figure 14:
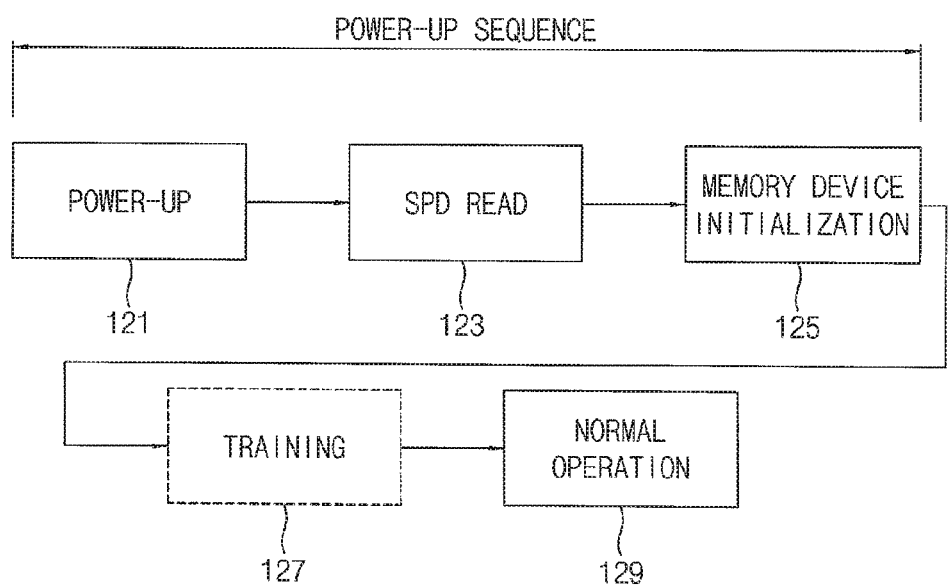
FIG. 14 illustrates an operation sequence of the memory system of FIG. 2 according to exemplary embodiments.

FIG. 14 illustrates an operation sequence of the memory system of FIG. 2 according to exemplary embodiments.

Referring to FIG. 14, after the memory system 20 is powered-up (121), serial presence detect (SPD), which is individual memory information, is read (123). The SPD may be formed as a non-volatile memory such as an electrically erasable programmable read-only memory (EEPROM). Information regarding the semiconductor memory devices 200a~200n, when a memory interface is designed, may be recorded to the SPD, and examples of the information include the number of row and column addresses, data width, a memory density for each semiconductor memory device. When the memory system 20 is initialized, the information of the semiconductor memory device 200a may be provided from the SPD to the memory controller 100.

The semiconductor memory device 200a is initialized (125). After initializing the semiconductor memory device 200a, a training operation may be selectively performed on the semiconductor memory device (127). After training the semiconductor memory device 200a, the normal memory operation may be performed on the semiconductor memory device (129).

In FIG. 14, the reference numerals 121, 123 and 125 may constitute a power-up sequence of the memory system 20. The cell data initializing operation may be performed during the power-up sequence.

Figure 15:
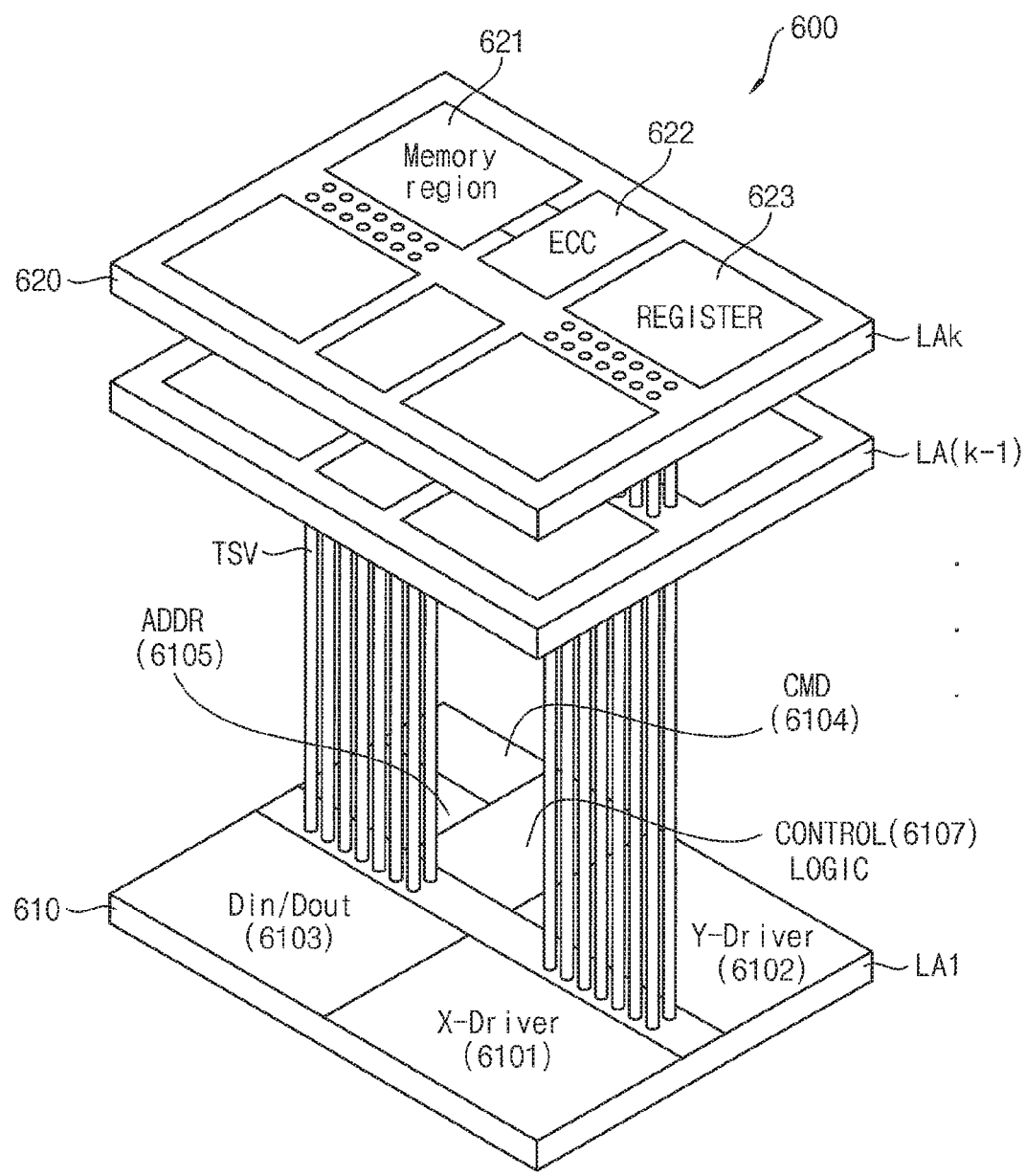
FIG. 15 is a structural diagram illustrating a semiconductor memory device according to exemplary embodiments.

FIG. 15 is a structural diagram illustrating a semiconductor memory device according to exemplary embodiments.

Referring to FIG. 15, a semiconductor memory device 600 may include first through kth semiconductor integrated circuit layers LA1 through LAk (k is an integer equal to or greater than three), in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals therebetween through through-silicon-vias (TSVs). The lowest first semiconductor integrated circuit layer LA1, as the interface or control chip, may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the kth semiconductor integrated circuit layer LAk or 620 as the slave chip.

The first semiconductor integrated circuit layer 610 may include various peripheral circuits for driving memory regions 621 provided in the kth semiconductor integrated circuit layer 620. For example, the first semiconductor integrated circuit layer 610 may include a row driver (X-Driver) 6101 for driving word-lines of a memory, a column driver (Y-Driver) 6102 for driving bit-lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include first memory blocks and a second memory block as described with reference to FIG. 6.

The first semiconductor integrated circuit layer 610 may further include a control logic 6107. The control logic 6107 may access the memory region 621 and may generate control signals for accessing the memory region 621 based on the command from the memory controller.

The kth semiconductor integrated circuit layer 620 may include an error correction circuit (ECC) 622 that performs an ECC encoding on data to be stored in the memory region 621 and performs an ECC decoding on data read from the memory region 621. The kth semiconductor integrated circuit layer 620 may further include a register 623 that stores the initializing bits. The error correction circuit (ECC) 622 and the register 623 perform the cell data initializing operation on the memory region 621 as described with reference to FIGS. 3 through 11.

Figure 16:
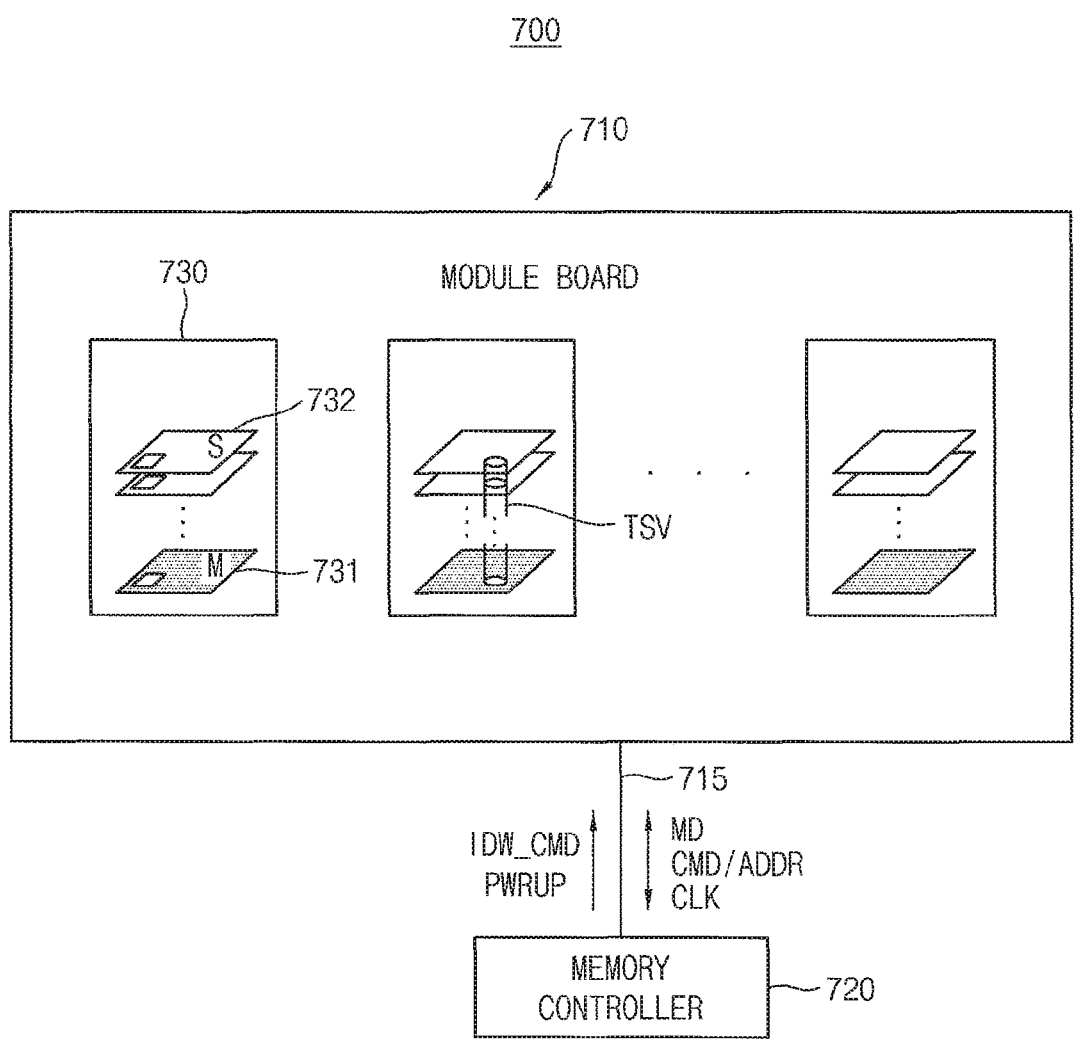
FIG. 16 illustrates a memory system including a semiconductor memory device according to exemplary embodiments.

FIG. 16 illustrates a memory system including the semiconductor memory device according to exemplary embodiments.

Referring to FIG. 16, a memory system 700 may include a memory module 710 and a memory controller 720. The memory module 710 may include at least one semiconductor memory device 730 mounted on a module board. It should be noted that a plurality of semiconductor memory devices 730 are shown in FIG. 16, but this is only an example, and in other exemplary embodiments the number of semiconductor memory devices 730 may be one or more than one. The semiconductor memory device 730 may employ the semiconductor memory device 200a of FIG. 3. For example, the semiconductor memory device 730 may be constructed as a DRAM chip or a MRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV. The master chip 731 and the slave chip 732 may employ the semiconductor memory device 200a of FIG. 3.

The memory module 710 may communicate with the memory controller 720 via a system bus 715. Main data MD, a command/address CMD/ADDR, and a clock signal CLK may be transmitted and received between the memory module 710 and the memory controller 720 via the system bus 715. In addition, the memory controller 720 may transmit to each of the semiconductor memory devices 730, an initializing write command IDW_CMD to direct the cell data initializing operation, or the power-up signal PWRUP, and the semiconductor memory devices 730 may perform the cell data initializing operation in response to the initializing write command IDW_CMD or the power-up signal PWRUP as described with reference to FIGS. 1 through 11.

In addition, in exemplary embodiments, a three dimensional (3D) memory array is provided in the semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648, the disclosures of which are hereby incorporated by reference in their entirety.

Figure 17:
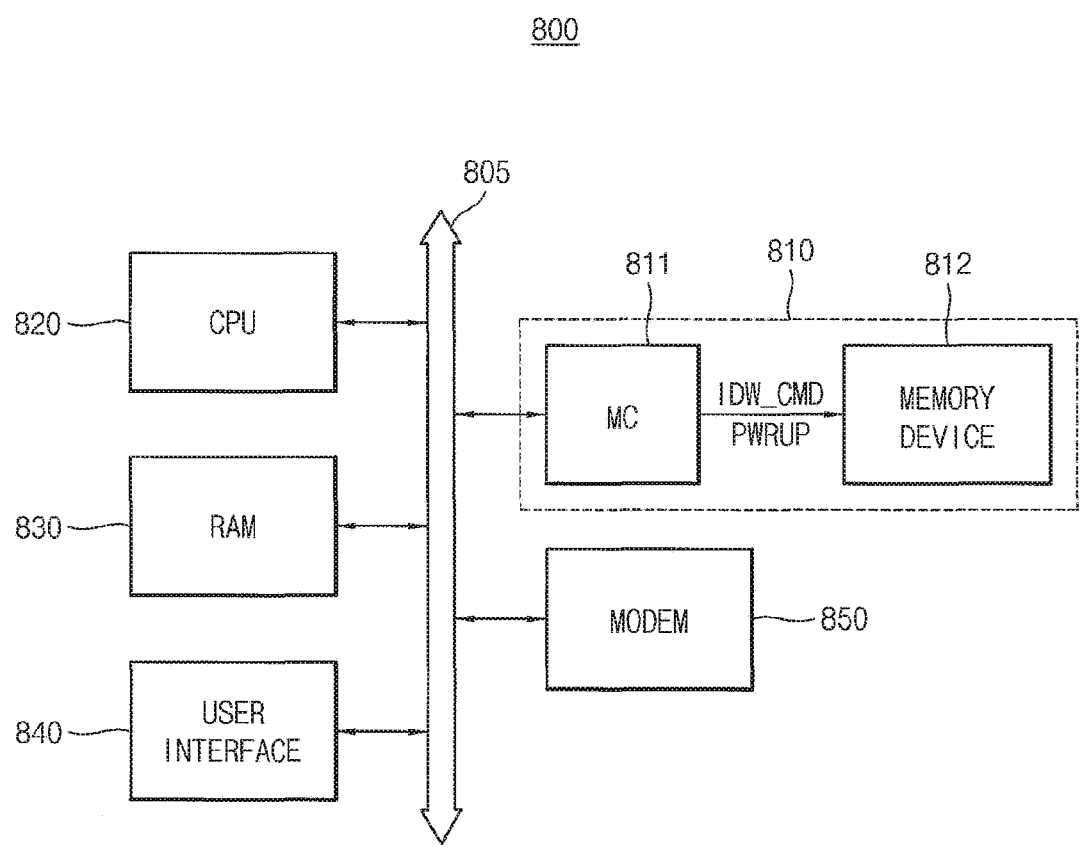
FIG. 17 is a block diagram illustrating a computing system including a semiconductor memory device according to exemplary embodiments.

FIG. 17 is a block diagram illustrating a computing system including the semiconductor memory device according to exemplary embodiments.

Referring to FIG. 17, a computing system 800 may be mounted on a mobile device or a desktop computer. The computing system 800 may include a memory system 810, a central processing unit (CPU) 820, a RAM 830, a user interface 840, and a modem 850 such as a baseband chipset, which are electrically connected to a system bus 805. The computing system 800 may further include an application chipset, a camera image processor (CIS), and an input/output device.

The user interface 840 may be an interface for transmitting data to a communication network or receiving data from the communication network. The user interface 840 may have a wired or wireless form, and may include an antenna or a wired/wireless transceiver. Data applied through the user interface 840 or the modem 850 or processed by the CPU 820 may be stored in the memory system 810.

The memory system 810 includes a semiconductor memory device 812 and a memory controller (MC) 811. The semiconductor memory device 812 may be a DRAM. Data processed by the CPU 820 or external data is stored in the semiconductor memory device 812. The memory controller 811 and the semiconductor memory device 812 may exchange an error vector in a code validation mode. The semiconductor memory device 812 may employ the semiconductor memory device 200a of FIG. 3. The memory controller 811 may transmit to the semiconductor memory device 812, an initializing write command IDW_CMD to direct the cell data initializing operation, or the power-up signal PWRUP, and the semiconductor memory device 812 may perform the cell data initializing operation in response to the initializing write command IDW_CMD or the power-up signal PWRUP as described with reference to FIGS. 1 through 11.

When the computing system 800 is a device that performs wireless communications, the computing system 800 may be used in a communication system such as code division multiple access (CDMA), global system for mobile communication (GSM), North American multiple access (NADC), or CDMA2000. The computing system 800 may be mounted on an information processing device such as a personal digital assistant (PDA), a portable computer, a web tablet, a digital camera, a portable media player (PMP), a mobile phone, a wireless phone, or a laptop computer.

Aspects of the present inventive concept may be applied to systems using semiconductor memory devices. For example aspects of the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or other such electronic devices.

According to the above-described exemplary embodiments, the semiconductor memory device, before performing a normal memory operation on the memory cell array by a first unit, perform a cell data initializing operation by writing initializing bits in the memory cell array by a codeword unit different from the first unit. When the normal memory operation is performed, the semiconductor memory device performs write operation based on the initializing bits and a main data whose unit is smaller than the codeword unit. Therefore, overhead may be reduced while maintaining performance when the unit of error correction is different from a unit of read/write operation.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
a memory cell array including a plurality of memory cells;
an input/output (I/O) gating circuit configured to, before performing a normal memory operation on the memory cell array according to a size of a first data unit, perform a cell data initializing operation by writing initializing bits in the memory cell array according to a size of a second data unit different from the size of the first data unit; and
an error correction circuit configured to perform an error correction code (ECC) encoding and an ECC decoding on a target page of the memory cell array according to the size of the second data unit, based on the initializing bits, which reduces errors and power consumption of the semiconductor memory device.

2. The semiconductor memory device of claim 1, wherein the size of the first data unit corresponds to a size of a prefetching data unit of the semiconductor memory device when the semiconductor memory device performs a read operation or a write operation, the size of the second data unit corresponds to a size of a codeword data unit of the semiconductor memory device, and the size of the codeword data unit is greater than the size of the prefetching data unit.

3. The semiconductor memory device of claim 1, wherein the I/O gating circuit performs the cell data initializing operation in response to an initializing write command from an external device.

4. The semiconductor memory device of claim 1, wherein the I/O gating circuit performs the cell data initializing operation in response to a power-up signal from an external device.

5. The semiconductor memory device of claim 1, further comprising:
a register that stores a plurality of subsets and provides one of the subsets as the initializing bits in response to an initializing start signal; and
a control logic circuit configured to output the initializing start signal to the register in response to one of an initializing write command from an external device and a power-up signal from the external device.

6. The semiconductor memory device of claim 5, wherein the initializing bits have one of a first logic level and a second logic level different from the first logic level.

7. The semiconductor memory device of claim 5, wherein the control logic circuit is configured to generate a first control signal to control the I/O gating circuit and a second control signal to control the error correction circuit in response to one of the initializing write command and the power-up signal.

8. The semiconductor memory device of claim 5, wherein when the semiconductor memory device performs a write operation to write a write data according to the size of the second data unit from an external device in the target page after performing the cell data initializing operation,
the error correction circuit:
reads a reset codeword according to the size of the second data unit from the target page, the reset codeword including a reset main data and a reset parity data, the reset main data and the reset parity data including the initializing bits;
corrects at least one error in the reset main data using the reset parity data; and
generates a write parity data based on the write data and a portion of the reset main data, and
the I/O gating circuit writes the write data and the write parity data in the target page.

9. The semiconductor memory device of claim 8, wherein the error correction circuit comprises:
an ECC encoder configured to read the reset codeword to correct the at least one error in the reset main data; and
an ECC decoder configured to generate the write parity data based on the write data and some of the reset main data.

10. The semiconductor memory device of claim 8, wherein the target page includes a normal region that stores the main data and a parity region that stores the write parity data.

11. The semiconductor memory device of claim 1, wherein each of the memory cells includes one of a dynamic memory cell and a resistive type memory cell.

12. The semiconductor memory device of claim 1, wherein the I/O gating circuit is configured to perform the cell data initializing operation during a power-up sequence of the semiconductor memory device.

13. A memory system comprising:
at least one semiconductor memory device; and
a memory controller configured to control the at least one semiconductor memory device, wherein the at least one semiconductor memory device comprises:
a memory cell array including a plurality of memory cells;
an input/output (I/O) gating circuit configured to, before performing a normal memory operation on the memory cell array according to a size of a first data unit, perform a cell data initializing operation by writing initializing bits in the memory cell array according to a size of a second data unit different from the size of the first data unit; and
an error correction circuit configured to perform an error correction code (ECC) encoding and an ECC decoding on a target page of the memory cell array according to the size of the second data unit, based on the initializing bits, which reduces errors and power consumption of the semiconductor memory device.

14. The memory system of claim 13, wherein the size of the first data unit corresponds to a size of a prefetching data unit of the semiconductor memory device when the semiconductor memory device performs a read operation or a write operation, the size of the second data unit corresponds to a size of a codeword data unit of the semiconductor memory device, the size of the codeword data unit is greater than the size of the prefetching data unit, and the memory cell array is a three-dimensional memory cell array.

15. The memory system of claim 13, wherein the at least one semiconductor memory device includes a plurality of semiconductor memory devices mounted on a module board,
the memory controller applies one of an initializing write command and a power-up signal to each of the semiconductor memory devices, and each of the semiconductor memory devices performs the cell data initializing operation in response to one of the initializing write command and the power-up signal.

16. A semiconductor memory device comprising:
a memory cell array;
a control circuit configured to control a cell data initializing operation on the memory cell array according to a size of a data unit of a codeword to initialize the memory cell array in a codeword state, prior to performing a normal access to the memory cell array according to a size of a data unit of a prefetch, the size of the data unit of the codeword being greater than the size of the data unit of the prefetch, which reduces errors and power consumption of the semiconductor memory device.

17. The semiconductor memory device of claim 16, wherein the control circuit performs the cell data initializing operation by writing initializing bits in the memory cell array according to the size of the data unit of the codeword.

18. The semiconductor memory device of claim 17, wherein the control circuit is further configured to perform an error correction code (ECC) encoding and an ECC decoding on a target page of the memory cell array by the data unit of the prefetch data unit, based on the initializing bits.

19. The semiconductor memory device of claim 18, wherein the target page includes a normal region that stores main data and a parity region that stores write parity data.

20. The semiconductor memory device of claim 16, wherein memory cells of the memory cell array comprise a magnetoresistive random access memory (MRAM).

* * * * *